United States Patent
Tanner et al.

(10) Patent No.: US 9,915,986 B2
(45) Date of Patent: *Mar. 13, 2018

(54) ACTIVE COOLING DEBRIS BYPASS FIN PACK

(71) Applicant: Google Inc., Mountain View, CA (US)

(72) Inventors: James Tanner, Los Gatos, CA (US); William Riis Hamburgen, Los Altos, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/249,908

(22) Filed: Aug. 29, 2016

(65) Prior Publication Data

US 2017/0031396 A1 Feb. 2, 2017

Related U.S. Application Data

(60) Continuation of application No. 14/191,665, filed on Feb. 27, 2014, now Pat. No. 9,454,195, which is a
(Continued)

(51) Int. Cl.
*H05K 7/20* (2006.01)
*G06F 1/20* (2006.01)
(Continued)

(52) U.S. Cl.
CPC .............. *G06F 1/203* (2013.01); *F28F 1/10* (2013.01); *F28F 1/40* (2013.01); *F28F 19/00* (2013.01);
(Continued)

(58) Field of Classification Search
CPC ..... F28F 1/40; F28F 19/00; F28F 1/10; G06F 1/203; G06F 1/20; G06F 1/1656;
(Continued)

(56) References Cited

U.S. PATENT DOCUMENTS 3,004,196 A  10/1961 Drexel
3,180,404 A   4/1965 Nelson et al.
(Continued)

FOREIGN PATENT DOCUMENTS

CN   201025749 Y    2/2008
CN   201146182 Y   11/2008
(Continued)

OTHER PUBLICATIONS

M. Baris Dogruoz et al., "Experiments and modeling of the hydraulic resistance of in-line square pin fin heat sinks with top by-pass flow," 2002 The Eighth Inter Society Conference on Thermal and Thermomechanical Phenomena in Electronic Systems, pp. 251-260, 2002.

(Continued)

*Primary Examiner* — Anatoly Vortman
(74) *Attorney, Agent, or Firm* — Lerner, David, Littenberg, Krumholz & Mentlik, LLP

(57) ABSTRACT

Aspects of the disclosure relate generally to active cooling or removing heat generated by a processor in a computing device. More specifically, a cooling system in a computing device may include a heatpipe which moves heat along a fin pack. The fin pack may include top and bottom ends as well as a plurality of fins. The fins may extend only a portion of the way between the ends thus creating an air duct. The air duct may allow debris to move along an edge of the fin and out of the computing device. The fins may also be curved to promote the forcing of debris through the fin pack while still allowing the heat to be expelled through the fins.

12 Claims, 10 Drawing Sheets

Related U.S. Application Data division of application No. 13/765,817, filed on Feb. 13, 2013, now Pat. No. 8,699,226, which is a continuation of application No. 13/438,312, filed on Apr. 3, 2012, now abandoned.

(51) Int. Cl.
  *F28F 1/40* (2006.01)
  *F28F 19/00* (2006.01)
  *F28F 1/10* (2006.01)
  *H01L 23/467* (2006.01)
  *G06F 1/16* (2006.01)
  *F28D 15/02* (2006.01)
  *F28D 1/02* (2006.01)
  *H01L 23/367* (2006.01)
  *H01L 23/427* (2006.01)

(52) U.S. Cl.
  CPC ............... *G06F 1/1656* (2013.01); *G06F 1/20* (2013.01); *H01L 23/467* (2013.01); *H05K 7/2039* (2013.01); *H05K 7/20136* (2013.01); *H05K 7/20336* (2013.01); *F28D 1/024* (2013.01); *F28D 15/0275* (2013.01); *H01L 23/3672* (2013.01); *H01L 23/427* (2013.01); *H01L 2924/0002* (2013.01)

(58) Field of Classification Search
  CPC . H01L 23/467; H01L 23/3672; H01L 23/427; F28D 15/0275; F28D 1/024; H05K 7/20136
  USPC .......... 361/679.47, 679.48, 679.54, 709, 710
  See application file for complete search history.

(56) References Cited

U.S. PATENT DOCUMENTS

| | | | |
|---|---|---|---|
| 4,707,726 A | | 11/1987 | Tinder |
| 4,765,397 A | * | 8/1988 | Chrysler ............... H01L 23/473 165/104.33 |
| 4,953,634 A | * | 9/1990 | Nelson ...................... F28F 3/02 165/147 |
| 5,002,123 A | | 3/1991 | Nelson et al. |
| 5,297,005 A | | 3/1994 | Gourdine |
| 5,339,214 A | | 8/1994 | Nelson |
| 5,422,787 A | | 6/1995 | Gourdine |
| 5,504,650 A | | 4/1996 | Katsui et al. |
| 5,597,035 A | | 1/1997 | Smith et al. |
| 5,630,469 A | | 5/1997 | Butterbaugh et al. |
| 5,712,762 A | | 1/1998 | Webb |
| 5,828,549 A | | 10/1998 | Gandre et al. |
| 5,912,802 A | | 6/1999 | Nelson |
| 5,963,424 A | | 10/1999 | Hileman et al. |
| 6,113,485 A | | 9/2000 | Marquis et al. |
| 6,137,680 A | | 10/2000 | Kodaira et al. |
| 6,154,368 A | | 11/2000 | Scofield |
| 6,198,630 B1 | | 3/2001 | Cromwell |
| 6,288,895 B1 | | 9/2001 | Bhatia |
| 6,304,445 B1 | | 10/2001 | Bollesen |
| 6,377,459 B1 | | 4/2002 | Gonsalves et al. |
| 6,446,708 B1 | * | 9/2002 | Lai ........................... F28F 3/02 165/185 |
| 6,452,797 B1 | | 9/2002 | Konstad |
| 6,504,712 B2 | | 1/2003 | Hashimoto et al. |
| 6,504,718 B2 | | 1/2003 | Wu |
| 6,707,675 B1 | | 3/2004 | Barsun et al. |
| 6,798,663 B1 | | 9/2004 | Rubenstein |
| 7,002,797 B1 | | 2/2006 | Wittig |
| 7,040,384 B2 | * | 5/2006 | Shiang-Chich ........... G06F 1/20 165/104.34 |
| D529,450 S | * | 10/2006 | Miyazawa ................... D13/179 |
| 7,180,740 B2 | | 2/2007 | Li et al. |
| 7,256,993 B2 | | 8/2007 | Cravens et al. |
| 7,310,228 B2 | | 12/2007 | Chen |
| 7,372,147 B2 | | 5/2008 | Dai et al. |
| 7,447,021 B2 | | 11/2008 | Chen |
| 7,742,295 B2 | | 6/2010 | Hata et al. |
| 7,952,872 B1 | | 5/2011 | Hata et al. |
| 2001/0023759 A1 | | 9/2001 | Katsui |
| 2002/0044424 A1 | | 4/2002 | Hashimoto et al. |
| 2002/0172008 A1 | | 11/2002 | Michael |
| 2002/0179285 A1 | | 12/2002 | Sas et al. |
| 2003/0116302 A1 | | 6/2003 | Sauciuc et al. |
| 2003/0210525 A1 | | 11/2003 | Chung et al. |
| 2004/0080912 A1 | | 4/2004 | Goth et al. |
| 2004/0150959 A1 | | 8/2004 | Sullivan |
| 2005/0041392 A1 | | 2/2005 | Chen |
| 2006/0061966 A1 | | 3/2006 | Korinsky et al. |
| 2006/0181851 A1 | | 8/2006 | Frank et al. |
| 2006/0221570 A1 | | 10/2006 | Yang et al. |
| 2007/0117502 A1 | | 5/2007 | Kim |
| 2007/0165374 A1 | | 7/2007 | Chen et al. |
| 2008/0074845 A1 | | 3/2008 | Sun et al. |
| 2008/0101017 A1 | | 5/2008 | Hata et al. |
| 2008/0165498 A1 | | 7/2008 | Gallina et al. |
| 2009/0034196 A1 | | 2/2009 | Wang et al. |
| 2010/0073877 A1 | | 3/2010 | Yu et al. |
| 2010/0079947 A1 | | 4/2010 | Aoki |
| 2011/0026223 A1 | | 2/2011 | Kaneko |
| 2011/0286178 A1 | | 11/2011 | Bridges et al. |

FOREIGN PATENT DOCUMENTS

| | | |
|---|---|---|
| CN | 202093454 U | 12/2011 |
| CN | 102375513 A | 3/2012 |
| JP | 2000165074 A | 6/2000 |
| JP | 2005-321287 A | 11/2005 |
| KR | 2019990004886 U | 2/1999 |

OTHER PUBLICATIONS

Thang Nguyen et al., "Advanced Cooling System Using Miniature Heat Pipes in Mobile PC," IEEE Transactions on Components and Packaging Technology, vol. 23, No. 1, pp. 86-90, Mar. 2000.
International Search Report and Written Opinion for Application No. PCT/US2013/034956 dated Jul. 23, 2013.
Extended European Search Report for Application No. 13771895.3 dated Oct. 6, 2015.
Examination Report for European Patent Application No. 13771895.3, dated Feb. 2, 2017.
Notification of the Second Office Action for Chinese Patent Application No. 201380018013.5, dated Jul. 14, 2017.
Notification of the First Office Action for Chinese Patent Application No. 201380018013.5, dated Feb. 22, 2017.
Examination Report for European Patent Application No. 13771895.3 dated Sep. 29, 2017. 7 pages.

* cited by examiner

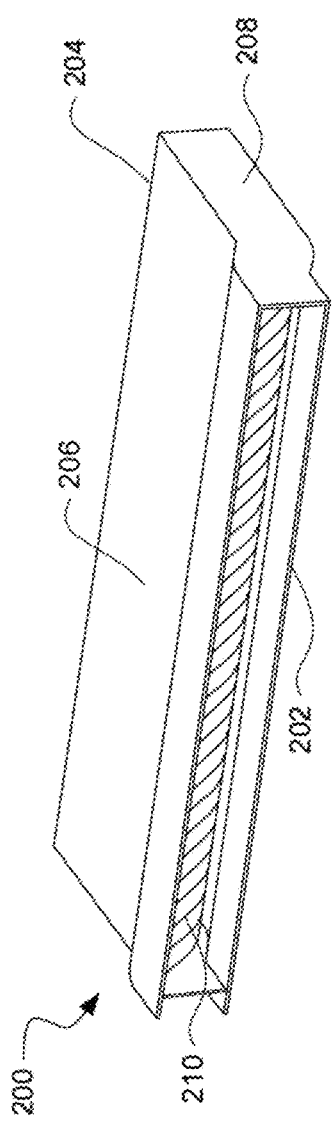
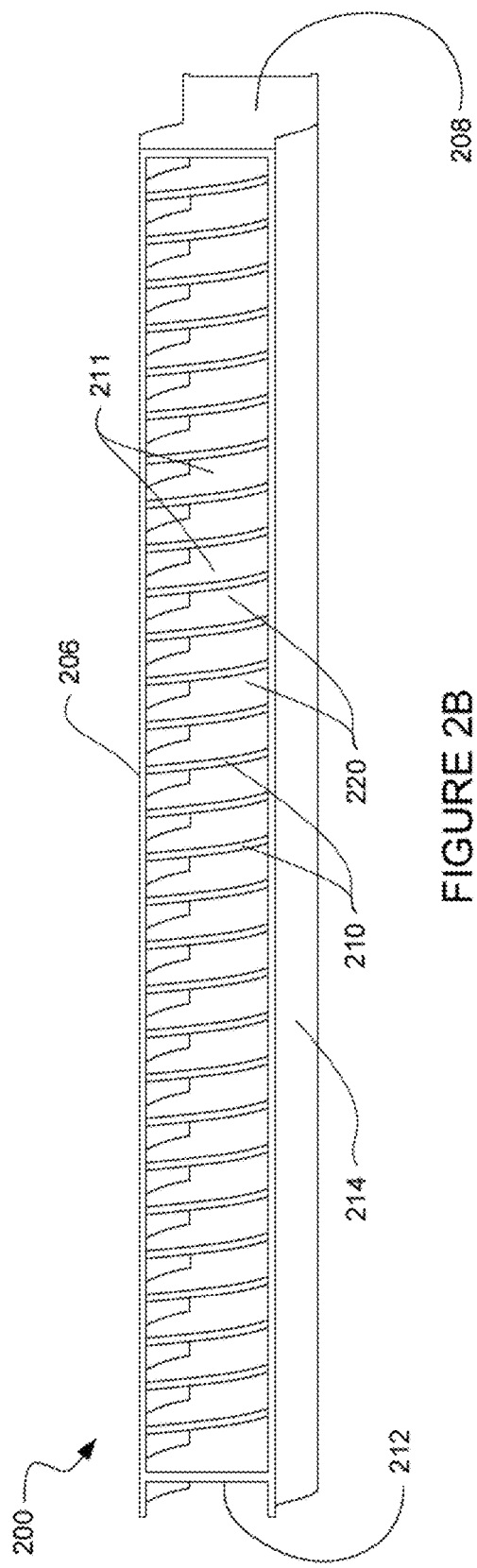
FIGURE 2A
FIGURE 2B

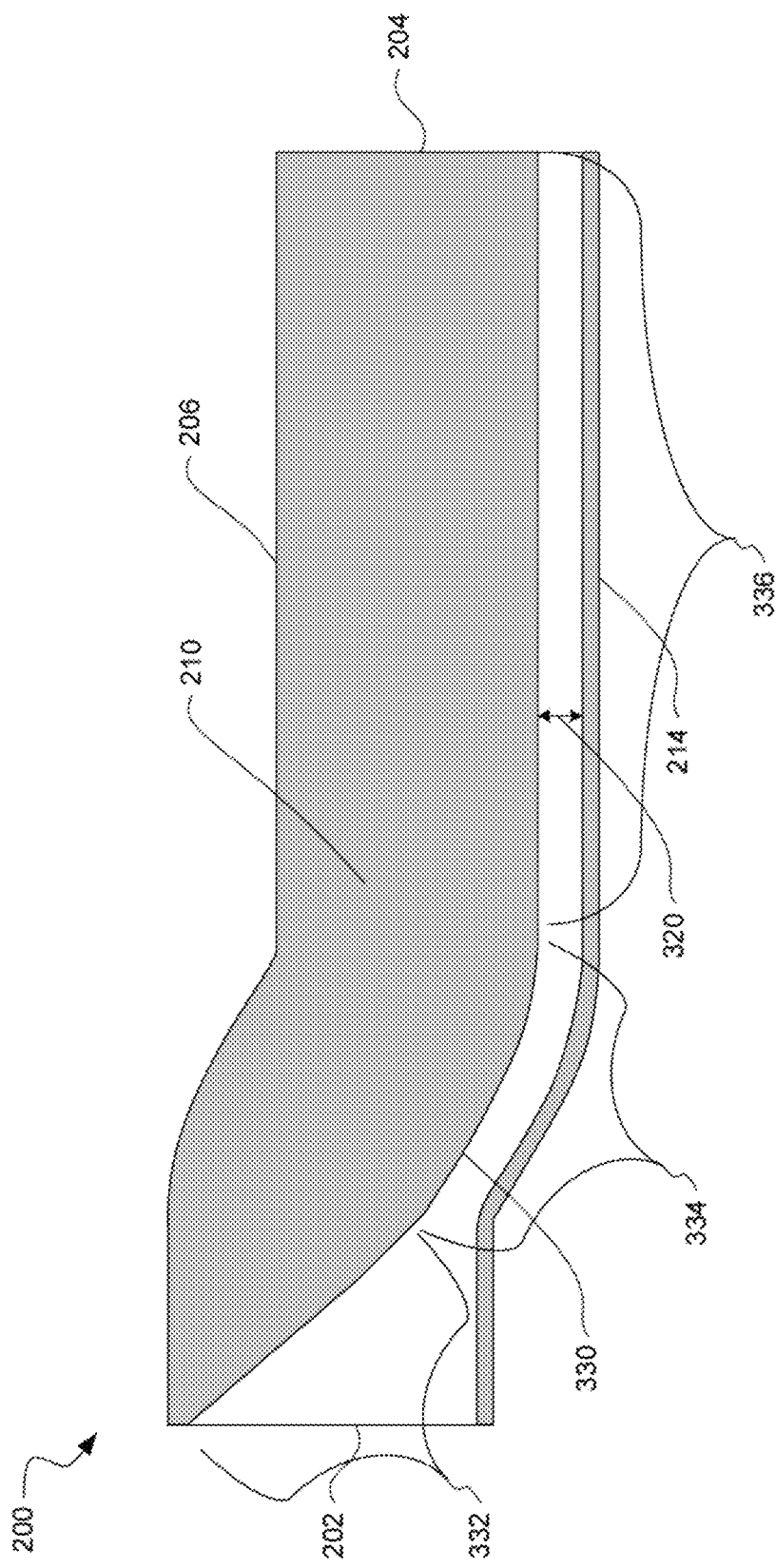

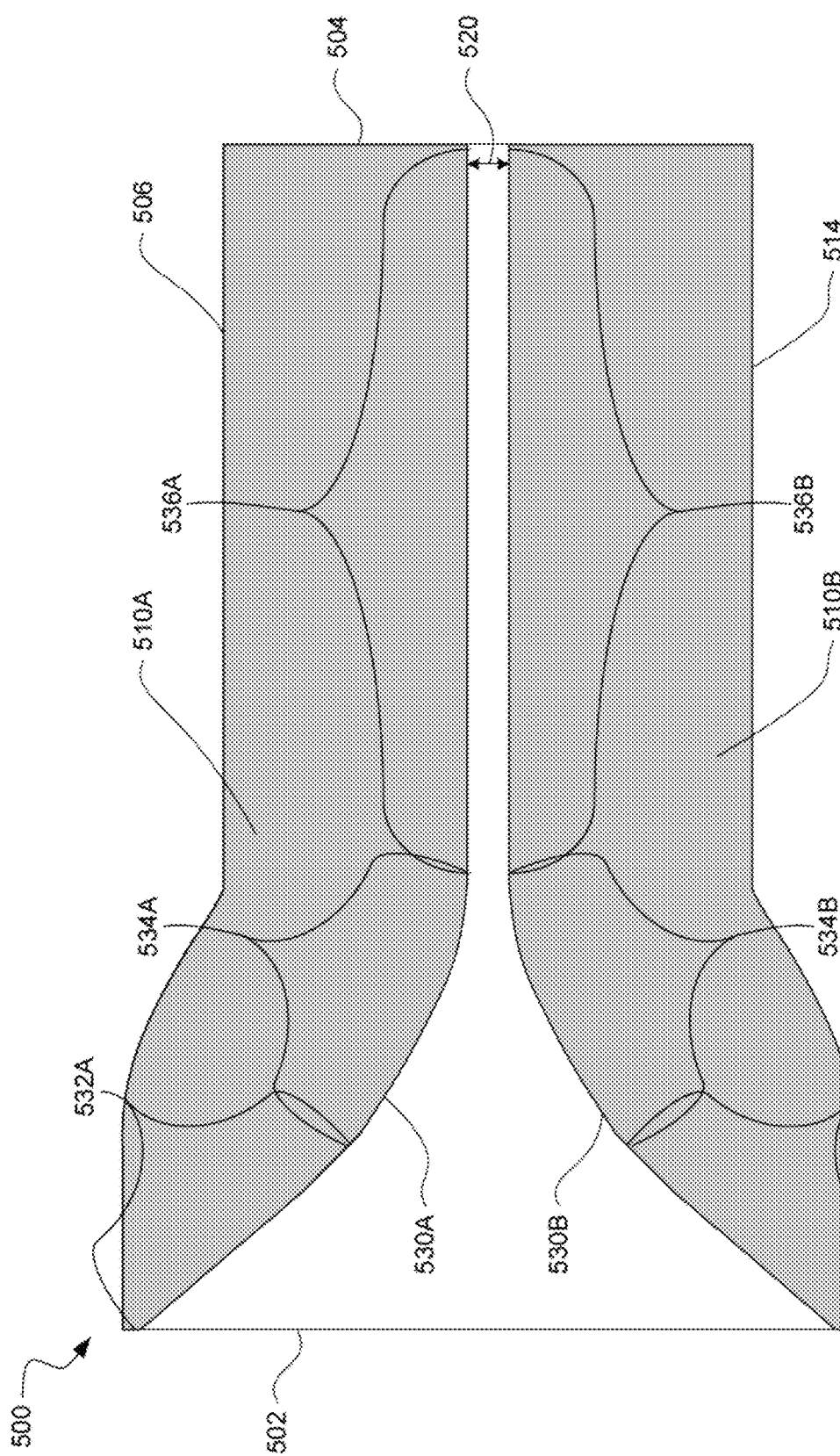

ACTIVE COOLING DEBRIS BYPASS FIN PACK

CROSS-REFERENCE TO RELATED APPLICATIONS

The present application is a continuation of U.S. patent application Ser. No. 14/191,665, filed on Feb. 27, 2014, which is a divisional of U.S. patent application Ser. No. 13/765,817, filed on Feb. 13, 2013, now U.S. Pat. No. 8,699,226, issued Apr. 15, 2014 which is a continuation of U.S. patent application Ser. No. 13/438,312, filed on Apr. 3, 2012, the disclosures of which are incorporated herein by reference.

BACKGROUND

In a typical computing device, a processor and other components can generate significant amount of heat. It is important to remove the heat from the processor in order to protect the processor and other components in the device. In order to expel the heat, it is typically transported through heat pipes into a fin pack. The heat is then conducted through the fins of the fin pack. A blower, or fan, blows air through the fin pack, and the air collects heat from the fins. The heated air leaves the fin pack and is expelled from the computing device through an exhaust vent.

As computing devices have become thinner and more compact, the fin packs have had to become smaller as well. Typical fin packs may have very narrow fins (for example only a few tenths of a mm wide). The greater the surface area of the fins, the greater the amount of heat that can be expelled by blowing air through the fins. In order to maximize the amount of surface area, typical fins span the height of the opening between a bottom end of the fin pack to the top end of the fin pack adjacent to the heat pipe. The fins may also be tightly spaced (for example only 1 mm apart).

This tight packing of the fins can cause debris to collect along the fins, such as fibers dust or other particles. The debris may increase the noise of the fan blowing through the fin pack, decrease the amount of air flowing through the fins, and decrease the amount of expelled heat. By reducing the efficiency of the fin pack, the operating temperature of the processor may also increase. In order to protect the processor, the computing device and users, the computing device may increase the fan speed to expel the heat, creating more noise, and/or slow down the speed of the processor. These may be an annoyance to users of these devices, and may also degrade the device's performance.

SUMMARY

One aspect of the disclosure provides a fin pack for expelling heat from a computing device. The fin pack includes a housing having a first sidewall, a second sidewall opposite of the first sidewall, a third sidewall between the first and the second sidewalls, a fourth sidewall opposite of the third sidewall and adjacent the first and second sidewalls, and an open first end adjacent the first, second, third, and fourth sidewalls and an open second end opposite of the open first end and adjacent the first second third and fourth sidewalls. The fin pack also includes a set of fins disposed in the housing. The set of fins is arranged to conduct heat from the first sidewall towards the second sidewall. Each fin of the set of fins is fixed to the first sidewall and extending towards the second sidewall. At least one of the fins of the set of fins does not contact the second sidewall such that there is an opening between an edge of the at least one fin and the second sidewall. The edge of the at least one fin is oriented towards the second sidewall. The opening between the edge extends along a complete length of the edge between the first open end and the second open end.

In one example, the edge of the at least one fin is curved at a portion of the edge adjacent to the open first end. In another example, the at least one fin has a first curve shape and the set of fins includes a second fin having a second curve shape. In this example, the second fin has a second height that is less than the distance between the first sidewall and the second sidewall to define a second opening between an edge of the at least one fin and the second sidewall, and the second curve shape is different from the first curve shape. In yet another example, the set of fins includes a second fin having a second height that spans the distance between the first sidewall and the second sidewall such that there is no opening between the second fin and the second sidewall. In a further example, the opening is no less than 0.1 millimeters. In another example, the fin pack also includes a plurality of openings between edges of each fin of the set of fins and the second sidewall such that there is an open space in the housing that extends from the third sidewall to the fourth sidewall.

Another aspect of the disclosure provides a fin pack for expelling heat from a computing device. The fin pack includes a housing having a first sidewall, a second sidewall opposite of the first sidewall, a third sidewall between the first and the second sidewalls, a fourth sidewall opposite of the third sidewall and adjacent the first and second sidewalls, and an open first end adjacent the first, second, third, and fourth sidewalls. The housing also includes an open second end opposite of the open first end and adjacent the first second third and fourth sidewalls. The fin pack also includes a first set of fins disposed in the housing. The first set of fins is arranged to conduct heat from the first sidewall towards the second sidewall. Each fin of the first set of fins is fixed to the first sidewall and extending towards the second sidewall. The fin pack also includes a second set of fins disposed in the housing. The second set of fins is arranged to conduct heat from the second sidewall towards the first sidewall. Each fin of the second set of fins is fixed to the second sidewall and extending towards the first sidewall. A first fin of the first set of fins extends towards a second fin of the second set of fins, such that the first fin and the second fin are a corresponding pair of opposing fins such that a closest fin of the second set of fins to the first fin of the first set of fins is the second fin of the second set of fins. An edge of the first fin and an edge of the second fin is oriented towards one another and are a distance apart.

In one example, a portion of the edge of the first fin curved. In another example, the first fin has a first curve shape and the second fin has a second curve shape, wherein the first curve shape is different from the second curve shape. In yet another example, the fin pack also includes a full fin between the first sidewall and the second sidewall, and the full fin has a second height that spans the distance between the first sidewall and the second sidewall. In another example, the fin pack also includes plurality of openings between edges of each fin of the set of fins and the second sidewall such that there is an open space in the housing that extends from the third sidewall to the fourth sidewall. In yet another example, the first fin of the first set of fins and the second fin of the second set of fins are arranged along an imaginary axis which is perpendicular to both the first and second sidewalls.

Yet another aspect of the disclosure provides a computing device. The computing device includes a processor configured to execute instructions, and heat is generated during execution of the instructions. The computing device also includes a heat pipe which transfers heat from the processor, and a fin pack adjacent to and contacting the heat pipe. The fin pack includes a housing having a first sidewall, a second sidewall opposite of the first sidewall, a third sidewall between the first and the second sidewalls, a fourth sidewall opposite of the third sidewall and adjacent the first and second sidewalls, and an open first end adjacent the first, second, third, and fourth sidewalls. The housing also includes an open second end opposite of the open first end and adjacent the first second third and fourth sidewalls. The fin pack also includes a set of fins disposed in the housing. The set of fins are arranged to conduct heat from the first sidewall towards the second sidewall. Each fin of the set of fins is fixed to the first sidewall and extending towards the second sidewall. At least one of the fins of the set of fins not contacting the second sidewall such that there is an opening between an edge of the at least one fin and the second sidewall. The edge of the at least one fin is oriented towards the second sidewall, and the opening between the edge extends along a complete length of the edge between the first open end and the second open end. The computing device also includes a blower for blowing air through the fin pack from the first open end towards the second open end to move the heat from the set of fins out of the fin pack. The opening is configured to allow debris to move freely through the fin pack from the first open end to the second open end.

In one example, the edge of the at least one fin is curved at a portion of the edge adjacent to the open first end and the curved portion allows the debris to move through the opening. In another example, the at least one fin has a first curve shape and the set of fins includes a second fin having a second curve shape, the second fin having a second height that is less than the distance between the first sidewall and the second sidewall such that there is an opening between an edge of the at least one fin and the second sidewall, the second curve shape is different from the first curve shape. In another example, the set of fins includes a second fin having a second height that spans the distance between the first sidewall and the second sidewall such that the second fin contacts the second sidewall. In yet another example, the fin pack further includes a plurality of openings between edges of each fin of the set of fins and the second sidewall such that there is an open space in the housing that extends from the third sidewall to the fourth sidewall.

A further aspect of the disclosure provides a computing device. The computing device includes a fin pack adjacent to a heat pipe which transfers heat from the processor. The fin pack includes a housing having a first sidewall, a second sidewall opposite of the first sidewall, a third sidewall between the first and the second sidewalls, a fourth sidewall opposite of the third sidewall and adjacent the first and second sidewalls. The housing also includes an open first end adjacent the first, second, third, and fourth sidewalls and an open second end opposite of the open first end and adjacent the first second third and fourth sidewalls. The fin pack also includes a first set of fins disposed in the housing. The first set of fins is arranged to conduct heat from the first sidewall towards the second sidewall. Each fin of the first set of fins is fixed to the first sidewall and extending towards the second sidewall. The fin pack also includes a second set of fins disposed in the housing. The second set of fins is arranged to conduct heat from the second sidewall towards the first sidewall. Each fin of the set of fins is fixed to the second sidewall and extending towards the first sidewall. A first fin of the first set of fins extends towards a second fin of the second set of fins. The first fin and the second fin are a corresponding pair of opposing fins such that a closest fin of the second set of fins to the first fin of the first set of fins is the second fin of the second set of fins. An edge of the first fin and an edge of the second fin are oriented towards one another and being a distance apart. The computing device also includes a blower for blowing air through the fin pack from the first open end towards the second open end to move the heat from the first and second sets of fins out of the computing device, wherein the opening is configured to allow debris to move freely through the fin pack from the first open end to the second open end.

In one example, the first fin has a first curve shape and the second fin has a second curve shape, wherein the first curve shape is different from the second curve shape. In another example, the computing device also includes a plurality of openings between edges of each fin of the set of fins and the second sidewall such that there is an open space in the housing that extends from the third sidewall to the fourth sidewall. In yet another example, the computing device is a laptop computer.

BRIEF DESCRIPTION OF THE DRAWINGS

FIGS. 2A and 2B are diagrams of an example fin pack in accordance with an implementation of the disclosure.

FIGS. 3A and 3B are cross sectional views of the example fin pack of FIGS. 2A and 2B.

FIG. 5A is a cross sectional view of an example fin pack in accordance with aspects of the disclosure.

DETAILED DESCRIPTION

Figure 1A:
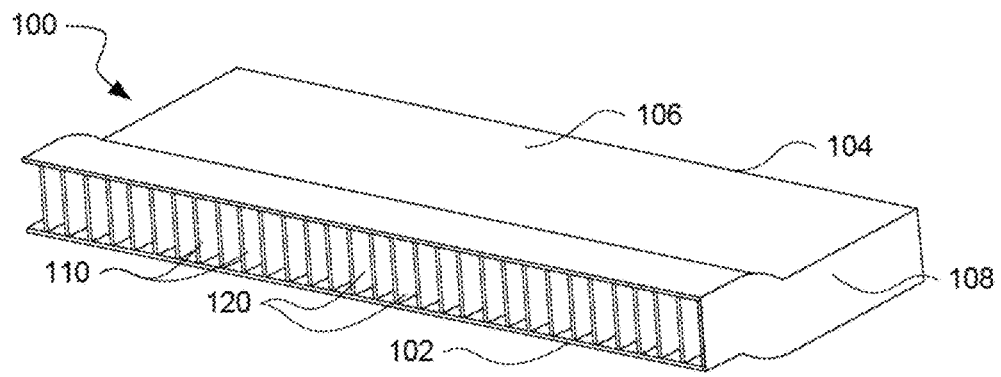
FIGS. 1A-1C are diagrams of example prior art fin packs.

Aspects of the disclosure relate generally to active cooling or removing heat generated by a processor in a computing device. In a typical mobile computing device (such as a laptop computer), heat is transported through a heat pipe and into a fin pack. Fin pack 100 of FIG. 1A is an example of a typical fin pack. The fin pack includes a housing having a first end 102, a second end 104, a top wall 106, a bottom wall (not shown), a first sidewall 108, and a second sidewall (not shown). The fins 110 may be very narrow, for example 0.1-0.5 mm, and the spaces 120 between the fins only slightly wider, for example 1 mm.

Figure 1B:
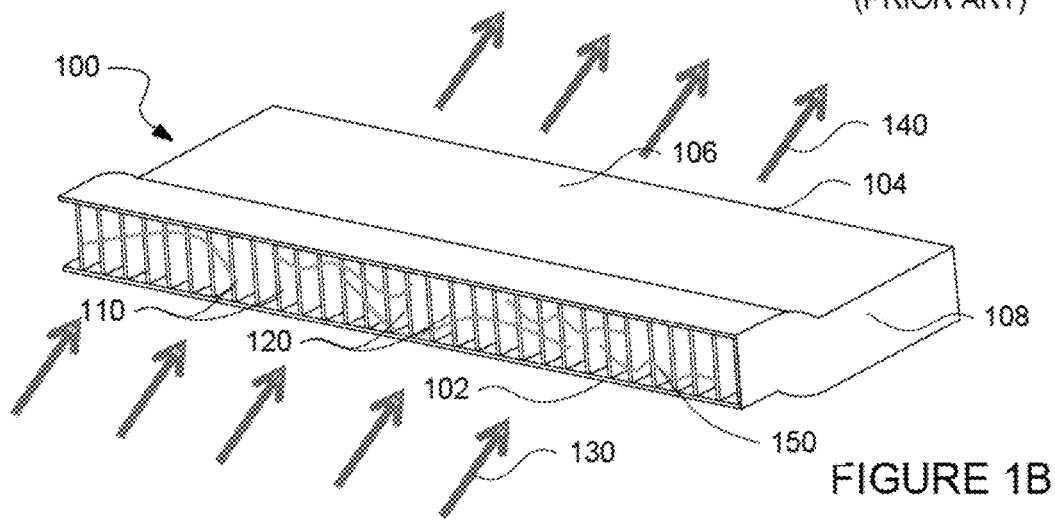

A blower, or fan, blows air through the fin pack in order to force the heat from the fin pack and the computing device. For example, as shown in FIG. 1B, air flows in the direction of arrows 130 towards the first end 102, through the spaces 120 between the fins 110, and out the second end 104 along arrows 140.

Figure 1C:
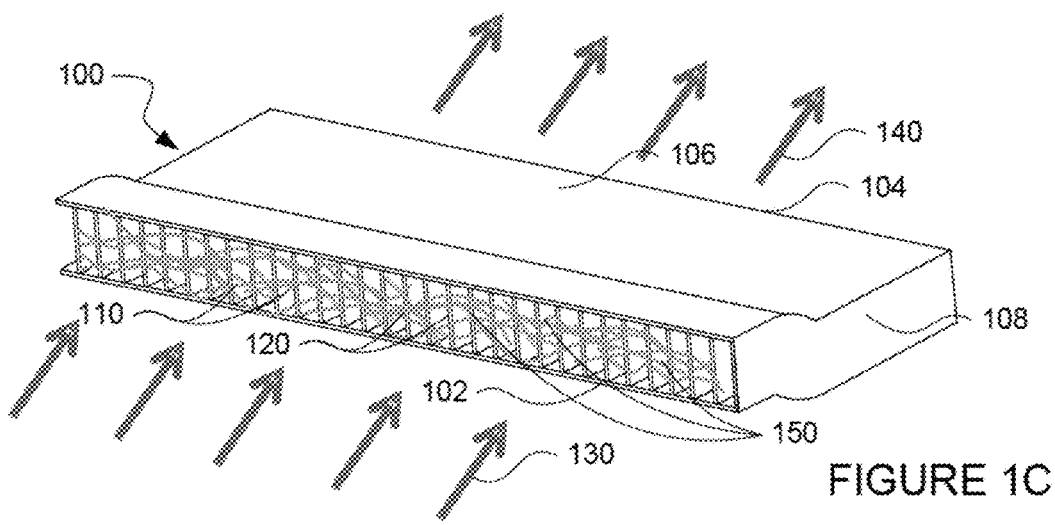

As the fan blows air through the fin pack, dust, fibers, and other particles may collect along the fins. For example, as fibers 150 may be caught along the fins at the first end 102 of the fin pack 100. Eventually, for example, after only a few months of use, the spaces 120 of fins 110 may become clogged by the fibers 150 as shown in FIG. 1C.

As noted above, clogging may cause a number of ill effects including, increasing the noise of the fan blowing through the fin pack and decreasing the amount of expelled heat. This, in turn, may increase the operating temperature of the processor as well as the temperature of a housing of the computing device. For example, if the skin or surface of the housing is close to the processor, fin pack, and/or heat pipe, the heat from these features may cause the skin temperature to increase. In order to protect the processor, the computing device, and users, the computing device may increase the fan speed to expel the heat (creating more noise) or slow down the speed processor (to reduce the amount of heat produced).

FIGS. 2A and 2B depict an example of a fin pack 200 arranged to reduce the likelihood of clogging described above. Fin pack 200 includes a first end 202 and an opposite, second end 204. When used in a computing device, the first end 202 is oriented towards a fan (not shown) or a source of moving air such that the air moves from the first end 202 towards the second end 204. Fin pack 200 also includes a partially enclosed housing having a top wall 206, a bottom wall 214, a first side wall 208, and a second side wall 212. In one example, the height of the fin pack (e.g. distance between the top and bottom walls 206, 214) may be only a few millimeters, such as 4.0 mm, or much larger. The fin pack 200 may include a set of fins, including fins 210, arranged along a wall, such as the top wall 206 of the fin pack. Each fin 210 is arranged perpendicularly to the top wall, although the fins may also be fixed at different angles The fins 210 have two flat side surfaces (such as 211) which are opposite to one another and an edge (see, e.g. edge 330 of FIG. 3A) between the side surfaces. Between the flat side surfaces of two adjacent different fins is an opening 220. The fins may be about 0.2 mm wide and spaced about 1.0 mm apart. The length and depth of the fin pack may depend upon the available space in the computing device.

Figure 3B:
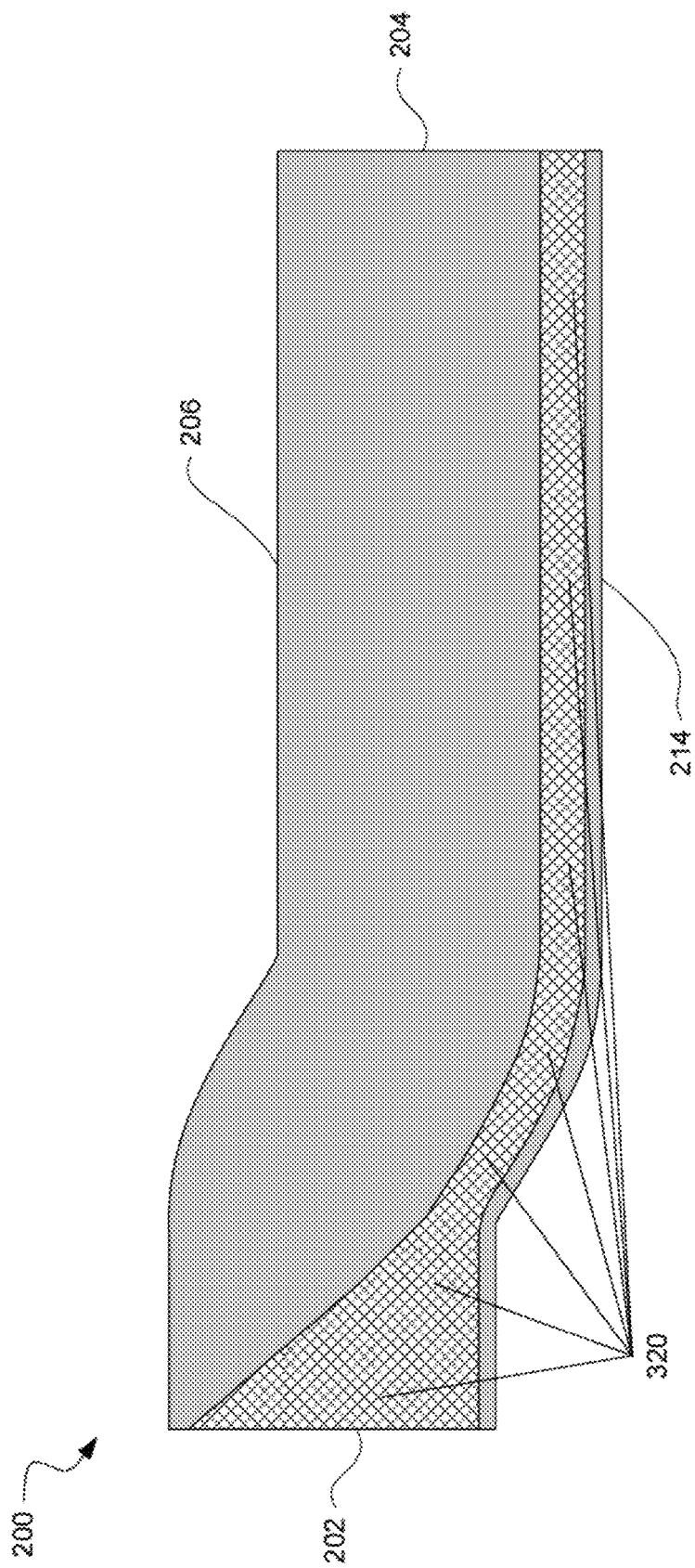

FIGS. 3A and 3B depict a cross sectional view of the fin pack 200. In this view, a fin 210 conducts heat from the top wall 206 towards the bottom wall 214. However, rather than spanning the distance between the top wall and the bottom wall, fin 210 ends at edge 330 leaving an opening 320 below the fin 210. As can be seen in FIG. 3B, the opening 320 extends from the first end 202 to the second end 204 and, although not shown in the figures, between the first side surface 208 to the second side surface 212. This opening between the edge and the bottom wall may be slightly lightly larger than the debris expected to be blown towards the fin pack. For example if a hair is about 0.3 mm, the opening may be about 0.5 mm or larger. As described in more detail below, the opening may act as an air duct which allows debris such as dust, fibers, and other particles to pass below the fins of the fin pack.

In this example, the edge of the fin 210 includes a first portion 332, a second portion 334, and a third portion 336. The second portion 334 of the fin includes a curved, rounded, or chamfered edge. This portion of the fins may promote the movement of debris through the fin pack while still allowing the heat to be expelled through the fins. The second portion, though depicted as curved in FIG. 3A, may also have other configurations such as a substantially flat or planar edge. The first portion 332 and third portion 336 are shown as substantially flat or planar edges, however, these portions may have other arrangements as well.

Figure 4:
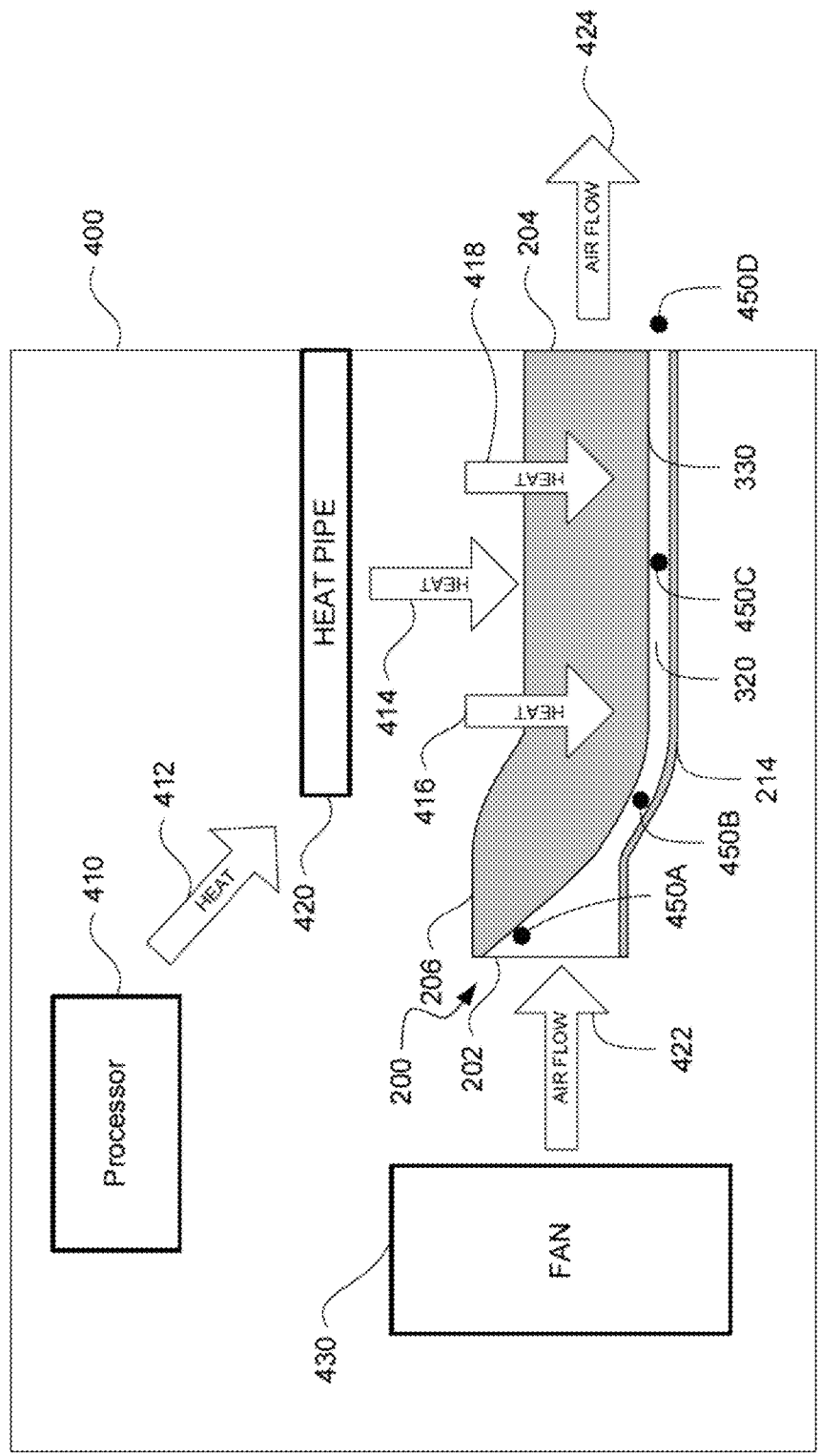
FIG. 4 is an example computing device in accordance with an implementation of the disclosure.

The computing device housing the fin pack may include a processor, memory, instructions, and other components typically present in general purpose computers. For example, as shown in FIG. 4, a computing device 400 may include a plurality of features such as a processor 410, a heat pipe 420, a fan 430, and the fin pack 200. Processor 410 may actually include one or more processors depending upon the arrangement of the features of computing device 400. It will be understood that the arrangement depicted is merely an illustrative example and not a required arrangement, orientation, sizing, etc. of the features of computing device 400. The computing device 400 may include various mobile computing devices such as a cellular phone, tablet PC, netbook, laptop computer, e-book reader, or other such devices with a relatively thin profile, for example a few centimeters or less.

As noted above, the computing device may include a processor which generates heat. As shown in FIG. 4, this heat generated by the processor 410 is transferred (as shown by heat arrow 412) to a heatpipe 420. The heatpipe 420 is located adjacent to and may also contact the top wall 206. The heat from the heat pipe is then conducted through the fin pack from the top wall 206 towards the bottom wall 214 (as shown by arrows 414, 416, 418). The fan 430 blows air, in the direction of air flow arrow 422 towards the fin pack 200. The air moves through the fin pack and along the fins 210 and out of the fin pack 200, and in some examples, the computing device 400 (as shown by air flow arrow 424).

As noted above, the opening may allow debris to move through the fin pack rather than being caught up against the fins. The opening 320 allows debris, identified as dots 450A-D, to move through and eventually out of the fin pack, rather than becoming stuck against the fin 210. For example, debris 450A-D may be a hair or other item which has been blown against fin 210. The first portion 332 (shown in FIG. 3A) of the edge 330 is angled away from the air flow. This angling may allow the debris at 450A of FIG. 4 to move along the edge of the fin 210 towards the second portion 334 (shown in FIG. 3A) of the edge 330. Returning to FIG. 4, when the debris reaches 450B, the curved portion of the edge 330 allows the debris to move towards the second end 204 of the fin pack 200. The debris continues to move along through the opening (as shown by debris 450C) until it has been expelled from the fin pack, and in some examples, the computing device (as shown by debris 450D).

The expulsion of debris from the fin pack, and in some examples, the computing device, may reduce the likelihood that debris will clog the fins. This in turn may reduce the likelihood that the device will need to increase the fan speed or reduce the processing speed of the processor to maintain a safe or required temperature. In addition, because of the relatively small height of the fin pack, the fin pack may still effectively transfer and expel heat even with the loss of surface area due to the shortened fins.

Other configurations of the fins may also be used. For example, as shown in FIG. 5A, a fin pack 500 may include a housing similar to the housing of fin pack 200: a top wall 506, bottom wall 514, and two side walls (not shown). The fin pack 500 also includes a first end 502 and a second end 504. As with the fin pack 200, when in use, the first end is oriented towards a fan (not shown) or a source of moving air such that the air moves from the first end 502 towards the second end 504.

Fin pack 500 may also include two sets of fins, rather than a single set as with fin pack 200. In this example, a fin 510A of a first set of fins may extend into the fin pack from the top wall 506 of the housing, and a fin 510B of a second set of fins may extend into the fin pack from the bottom wall 514 of the housing. Each of the fins 510A of the first set of fins is arranged perpendicularly to the top wall 506 while each of the fins 510B of the second set of fins is arranged perpendicularly to the bottom wall 514. However, the fins need not be perpendicular to the top and/or bottom walls, but may be fixed at other angles. Each of the fins of fin pack 500 includes two side surfaces which are opposite to one another and an edge (see, e.g. edges 530A and 530B of FIG. 5A) between the side surfaces. Between the flat side surfaces of two adjacent fins of the same set of fins is an opening 520 (similar to opening 220 of FIG. 2B).

Figure 5B:
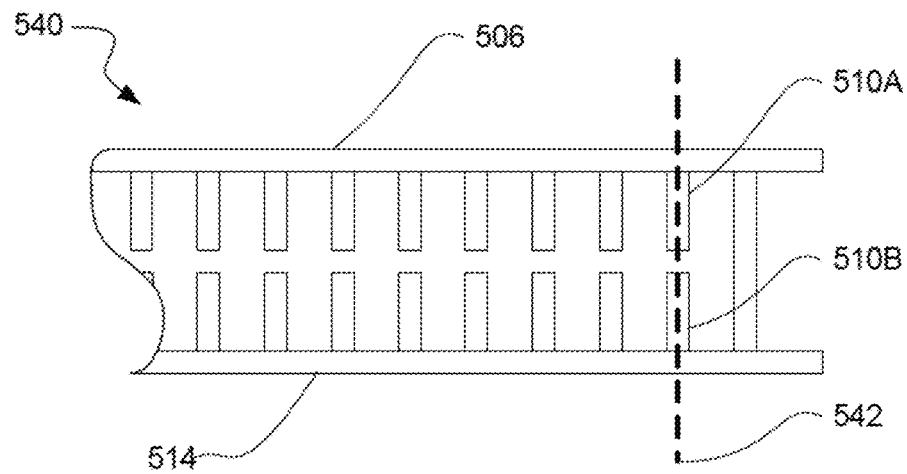
FIGS. 5B and 5C are example fin packs in accordance with aspects of the disclosure.
Figure 5C:
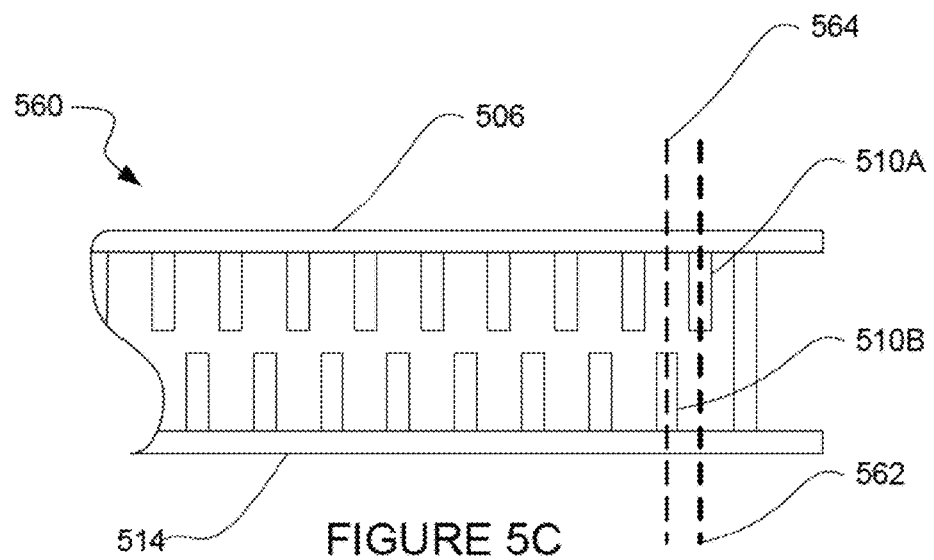

In the examples of a fin pack having two sets of fins (as in the example of fin pack 500), each fin of the first set of fins may be associated with an opposing fin of the second set of fins. For example, fins 510A and 510B of each of the examples of FIGS. 5B and 5C may be opposing fins. In these examples, the closest fin to fin 510A of the first set of fins is fin 510A's opposing fin, or fin 510B. These fins may line up directly above and below one another as shown in fin pack 540 of FIG. 5B or may be staggered as shown in fin pack 560 of FIG. 5C. For example, in FIG. 5B, fins 510A and 510B are lined up along an imaginary longitudinal axis 542 which is perpendicular to the top and bottom walls 506, 514. In FIG. 5B, fins 510A and 510B are each lined up along imaginary longitudinal axes 562 and 564, respectively. These imaginary longitudinal axes are parallel to one another, but both perpendicular to the top and bottom walls 506, 514. As shown in FIG. 5A, the fins 510A and 510B may not extend the total distance between the top wall 506 and the bottom wall 514. This may result in the opening 520 between the edges of the opposing fins.

In this configuration, the fin pack may be adjacent to two different heat pipes, one heat pipe being adjacent one end of the fin pack and another heat pack being adjacent the other end of the fin pack. For example, computing device 600 may include processors 610A and 610B. Although depicted as two distinct processors, these processors may actually be the same (i.e. a single) processor. The computing device 600 may be similar to computing device 400, for example include a processor, memory, instructions, and other components typically present in general purpose computers. It will be understood that the arrangement depicted is merely an illustrative example and not a required arrangement, orientation, sizing, etc. of the features of computing device 600.

Returning to FIG. 5A, the fins 510A and 510B each conduct heat from the top wall 206 or the bottom wall 214. In this example, each fin includes an edge 530A or 530B having a first portion 532A or 532B, a second portion 534A or 534B, and a third portion 536A or 536B. The second portions of the fin may include a curved, rounded, or chamfered edge. These curved portions of the fins may promote the movement of debris through the fin pack while still allowing the heat to be expelled through the fins. As with the portions of fin 210 of FIG. 3, the first, second, and third portions of fins 510A and 510B of FIG. 5A may also have other arrangements.

Figure 6:
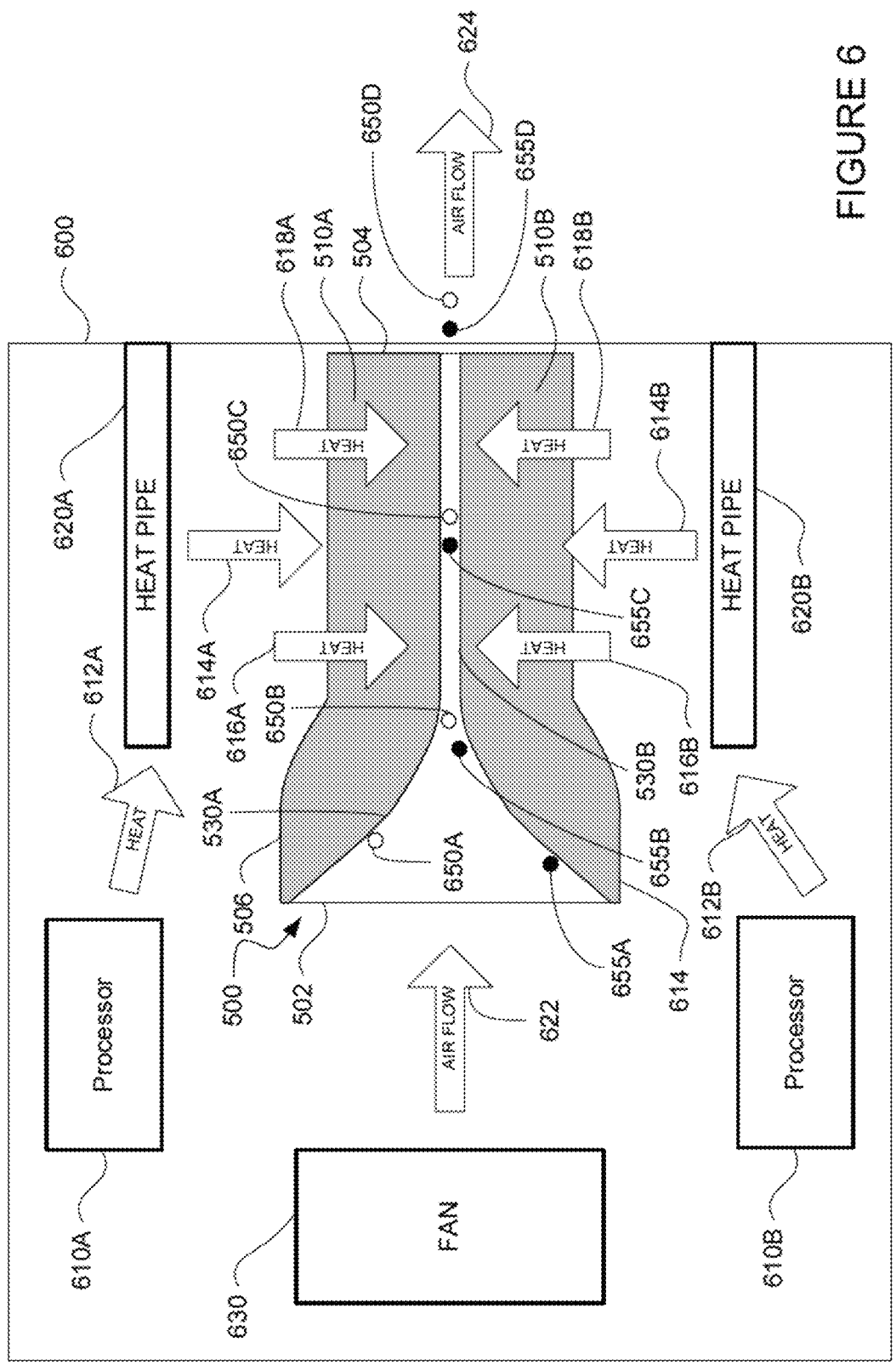
FIG. 6 is an example computing device in accordance with an implementation of the disclosure.

Processors 610A and 610B of FIG. 6 generate heat during operation. The heat is transferred (as shown by heat arrows 612A and 612B) to heatpipes 620A and 620B. Each heatpipe is located adjacent to and may also contact the top wall 506 or bottom wall 514 of fin pack 500. The heat from the heat pipes is then conducted through the fin pack. For example heat from heat pipe 620A is conducted through fin 510A as shown by arrows 614A, 616A, 618A, from the top wall 506 towards the bottom wall 514, and heat from the heatpipe 620B is conducted through fin 510B from the bottom wall 514 towards the top wall 506 as shown by arrows 614B, 616B, 618B. The fan 630 blows air, in the direction of air flow arrow 622 towards the fin pack 500. The air moves through and along the fins 510A and 510B and out of the fin pack, and in some examples, the computing device (as shown by air flow arrow 624).

As with opening 320, opening 520 may allow debris to move freely through the fin pack rather than being caught up against the fins (see FIGS. 1B and 1C). For example, the opening 520 allows debris, represented by dots 650A-D or 655A-D, to move through and eventually out of the fin pack, rather than becoming stuck against the fins 510A or 510B. In one example, debris 650A-D may be a hair or other item which has been blown against fin 510A. The first portion 532A (shown in FIG. 5A) of the edge 530A is angled away from the air flow. This angling may allow the debris at 650A of FIG. 6 to move along the edge of the fin 510A towards the second portion 534A (shown in FIG. 5A) of the edge 530A. Returning to FIG. 6, when the debris reaches 650B, the curved portion of the edge 530 allows the debris to move towards the second end 504 of the fin pack 500. The debris continues to move along through the opening (as shown by debris 650C) until it has been expelled from the fin pack, and in some examples, the computing device as well (as shown by debris 650D).

In another example, debris 655A-D may be a hair or other item which has been blown against fin 510B. The first portion 532B (shown in FIG. 5A) of the edge 530 is angled away from the air flow. This angling may allow the debris at 655A of FIG. 6 to move along the edge of the fin 510B towards the second portion 534B (shown in FIG. 5A) of the edge 530B. Returning to FIG. 6, when the debris reaches 655B, the curved portion of the edge 530 allows the debris to move towards the second end 504 of the fin pack 500. The debris continues to move along through the opening (as shown by debris 655C) until it has been expelled from the fin pack, an in some examples, the computing device as well (as shown by debris 655D).

The fin packs may have various configurations depending on the space available for the fin pack. For example, although fin packs 100, 200, and 500 have an s-shaped profile, other fins, such as fin packs 700, 720, 740, 760, and 780 may have a rectangular profile (as shown in FIGS. 7A-7E).

Figure 7A:
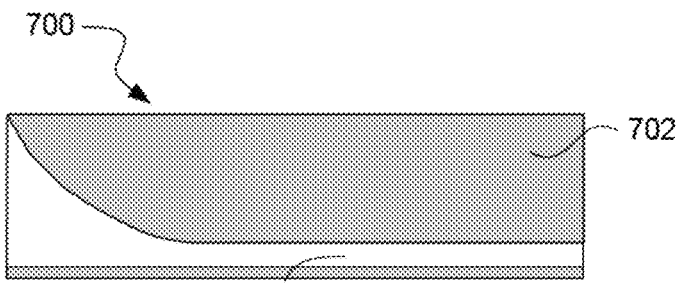
FIGS. 7A-7E are cross sectional views of an example fin packs in accordance with aspects of the disclosure.
Figure 7B:
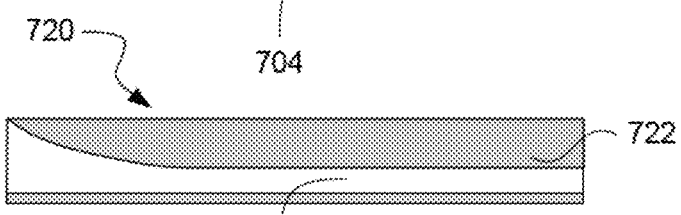
Figure 7C:
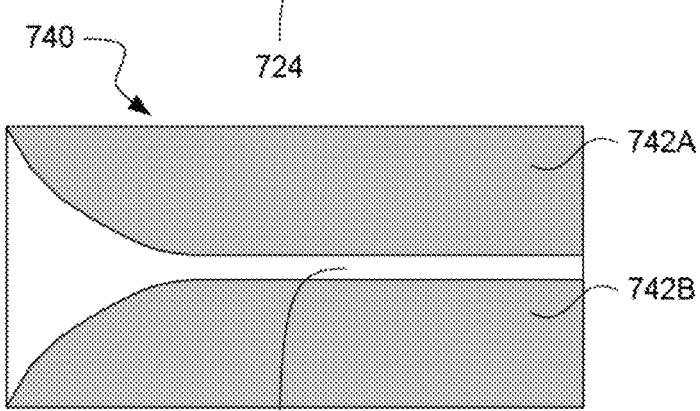
Figure 7D:
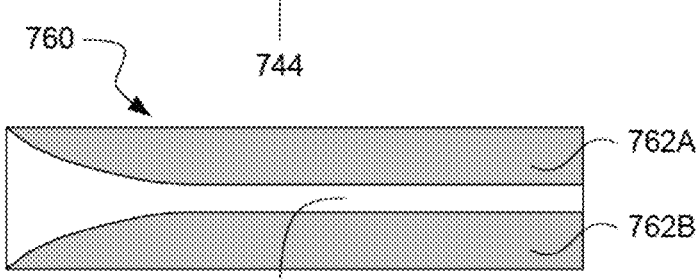
Figure 7E:
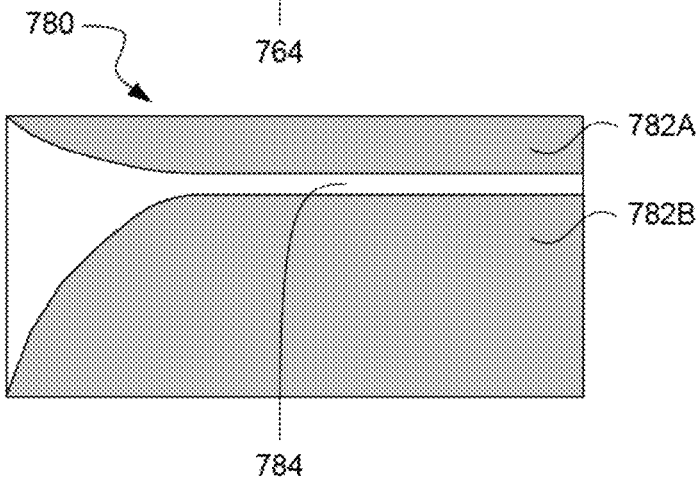

In addition to the shapes and configurations of the examples depicted by fins 210 and 510, the fins may have any number of configurations and shapes as noted above. For example, FIGS. 7A and 7B depict "single" fin packs 700 and 720 (similar to fin pack 200) having a single set of fins. Fin packs 700 and 720 include fins 702 and 722 of different shapes. FIGS. 7C-7E depict "dual" fin packs 740, 760, and 780 (similar to fin pack 500) having two sets of fins: 742A and 742B, 762A and 762B, 782A and 782B. Fin packs 720, 760, and 780 include fins 722, 762A, 762B, and 782A having a more gradual curve that fins 210, 510A, 510B, or 702 of fin packs 200, 500, or 700. Like fin pack 200, fin packs 700 and 720 include openings 704 and 724 which may allow debris to move freely through the fin packs and be expelled from a computing device (as described with regard to fin back 200 above). Similarly, like fin pack 500, fin packs 740, 760, and 780 include openings 744, 764, and 784 which allow debris to move freely through the fin packs and be expelled from a computing device (as described with regard to fin pack 500 above).

In another example, although fins 510A and 510B are shown as symmetrical in fin pack 500, as shown in FIG. 7E, fin pack 780 may include asymmetrical fins 782A and 782B. In such a heat pack, the length of the fins may be determined based on the amount of heat to be expelled from a heat pipe. For example, if a typical fin pack, with no air duct opening, were used between two heat pipes, where the first heat pipe is hotter or more efficient than the second heat pipe, there may be a reduction in the temperature of the fins at a point between the top and bottom walls. It is at this point that the air duct may be placed between two sets of fins in order to allow debris to move freely through the fin pack while still maintaining a high level of efficiency.

In still other examples, the fin packs may include a single or double set of fins where each set has plurality of fins of different heights. For example, only some of the fins may span the distance between the top wall and the bottom wall, such as every other fin or every two or more fins. The number of fins in a row that need not span this distance will define the width of the duct and also the size of debris that may be forced through the duct. Returning to the examples of fin pack 200 of FIGS. 2A and 2B, all of the fins between the sidewalls 208 and 212 do not span the entire distance between the top wall 206 and the bottom wall 214. As noted above other fin packs, for instance those shown in FIGS. 8A and 8B, may include fins of different heights. For example, FIG. 8A includes fin pack 800 having fins 810A which include an opening between the top wall 806 and the bottom wall 814. These fins allow for debris to move below the fins. Fin pack 800 also includes a full fin 810B which extends between the top wall and the bottom wall 814 such that there is no opening between the full fin and the bottom wall. In this example, the fin pack is essentially divided into two sets (set 816A and set 816A) of fins. Each set is associated with an opening, 816B and 818B, respectively. Rather than spanning from the first sidewall 812 of the fin pack to the second sidewall 808 of the fin pack as with openings 320 and 520, openings 818A and 818B span only the distance between the sidewalls and full fin 810B. Similar to openings 320 and 520, openings 818A and 818B may allow debris to flow through the fin pack.

Figure 8A:
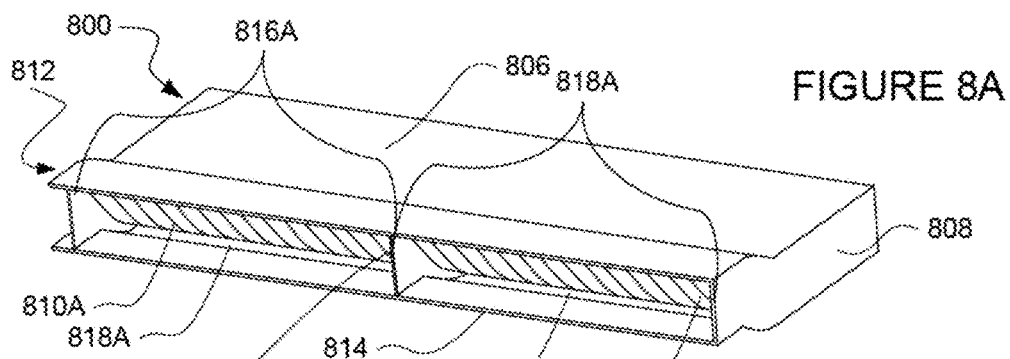
FIGS. 8A-8D are diagrams of an example fin packs in accordance with implementations of the disclosure.
Figure 8B:
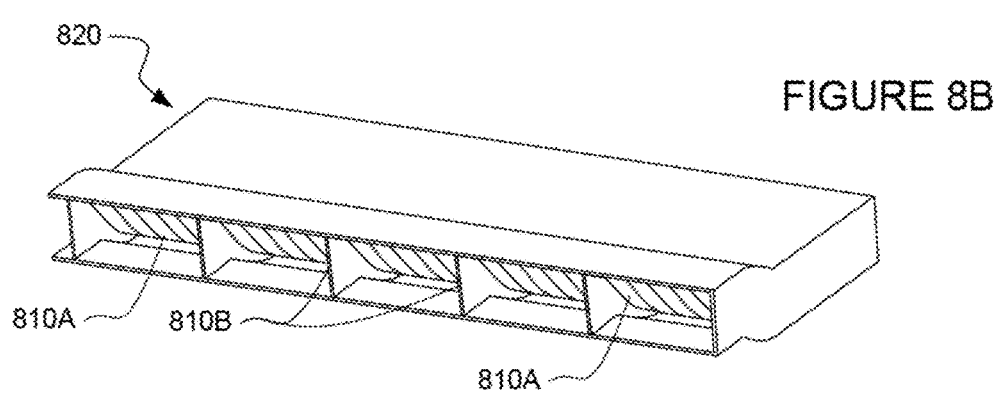
Figure 8C:
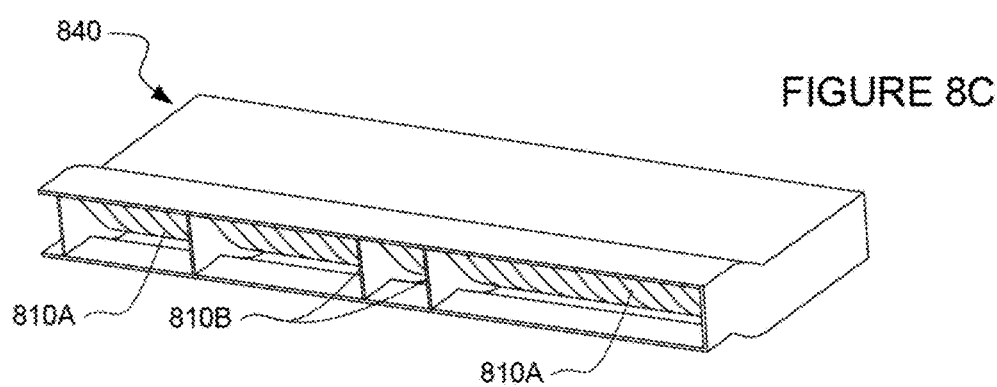

A fin pack may also have several full fins (such as fin 810B) with various numbers of shortened fins (fin 810A) between them. For example, FIGS. 8A and 8B depict example fin packs 800 and 820, where several full fins 810B are evenly spaced in the fin pack. FIG. 8C depicts an example fin pack 840 where several full fins 810B are spaced at varying intervals. In other words, in FIG. 8C, the number of shortened fins 810A between two full fins or between a sidewall and a full fin, varies. In another example, shown in FIG. 8D, the fin pack may include fins 810A and 810C of different shapes within the same set of fins. A fin pack may therefore include at least one shorted fin (such as fin 210, 510A, 510B, 702, 722, 742A, 742B, 762A, 762B, 782A, 782B, 810A, or 810C) and any number of full and or shortened fins.

Figure 8D:
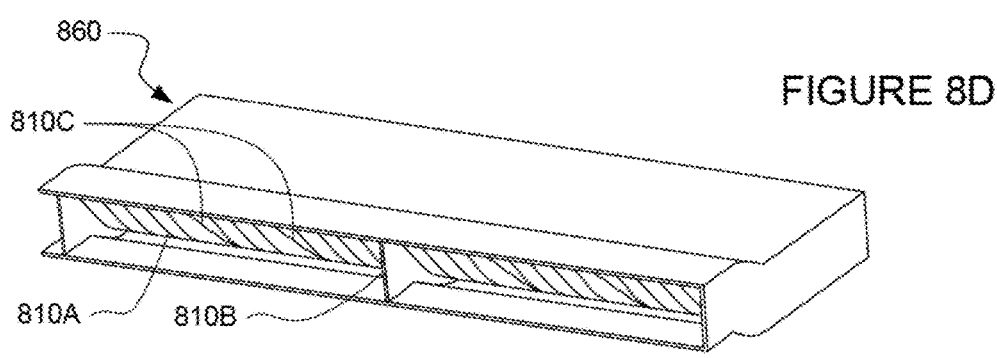

In yet another example, a fin pack may include shortened fins of different heights. For example, as shown in FIG. 8D, fin pack 840 includes shortened fins 810A of a first shape, full fins 810B, and shortened fins 810C of a different shape from shortened fins 810A. As with the full fins, the shortened fins of a different shape may be spaced evenly or at various intervals.

The fin packs described herein may be made of various metals or other heat conducting materials. For example, the housing and fins may be formed of a metal (including alloys) with a low thermal resistance in order to conduct the heat down or along the fins as described above.

As these and other variations and combinations of the features discussed above can be utilized without departing from the subject matter defined by the claims, the foregoing description of the embodiments should be taken by way of illustration rather than by way of limitation of the subject matter defined by the claims. It will also be understood that the provision of the examples disclosed herein (as well as clauses phrased as such as, "including" and the like) should not be interpreted as limiting the claimed subject matter to the specific examples; rather, the examples are intended to illustrate only one of many possible embodiments. Further, the same reference numbers in different drawings may identify the same or similar elements.

The invention claimed is:

1. A fin pack for expelling heat from a computing device, the fin pack comprising:
a housing having a first sidewall, a second sidewall opposite of the first sidewall, a third sidewall between the first and the second sidewalls, a fourth sidewall opposite of the third sidewall and adjacent the first and second sidewalls, and a first open end adjacent the first, second, third, and fourth sidewalls and a second open and opposite of the first open end and adjacent the first second third and fourth sidewalls; and
a set of fins disposed in the housing, the set of fins being arranged to conduct heat from the first sidewall towards the second sidewall, each fin of the set of fins being fixed to the first sidewall and extending towards the second sidewall, at least one of the fins of the set of fins not contacting the second sidewall such that there is an opening between a portion of an edge of the at least one fin and the second sidewall, the portion of the edge of the at least one fin being oriented towards the second sidewall, and the opening between the portion of the edge of the at least one fin and the second sidewall extending along a complete distance between the first open end and the second open end, the portion of the edge of the at least one fin is curved away from the first open end and towards the second sidewall and the second open end in order to assist debris in moving through the housing along the portion of the at least one fin away from the first open end and towards the second sidewall and the second open end, and wherein the at least one fin has a first curve shape and the set of fins includes a second fin having a second curve shape, the second fin having a second height that is less than a distance between the first sidewall and the second sidewall to define a second opening between an edge of the second fin and the second sidewall, the second curve shape being different from the first curve shape.

2. The fin pack of claim 1, wherein the second curve shape is arranged to assist debris in moving from the open first end towards the second sidewall and the open second end.

3. The fin pack of claim 1, wherein the set of fins includes a third fin having a second height that spans the distance between the first sidewall and the second sidewall such that there is no opening between the third fin and the second sidewall.

4. The fin pack of claim 1, wherein the opening is no less than 0.1 millimeters.

5. The fin pack of claim 1, further comprising a plurality of openings between edges of each fin of the set of fins and the second sidewall such that there is an open space in the housing that extends from the third sidewall to the fourth sidewall.

6. A computing device comprising:
a processor configured to execute instructions, whereby heat is generated during execution of the instructions;
a heat pipe which transfers heat from the processor, a fin pack adjacent to and contacting the heat pipe, the fin pack having:
  a housing having a first sidewall, a second sidewall opposite of the first sidewall, a third sidewall between the first and the second sidewalls, a fourth sidewall opposite of the third sidewall and adjacent the first and second sidewalls, and a first open end adjacent the first, second, third, and fourth sidewalls and an second open end opposite of the open first end and adjacent the first second third and fourth sidewalls; and
  a set of fins disposed in the housing, the set of fins being arranged to conduct heat from the first sidewall towards the second sidewall, each fin of the set of fins being fixed to the first sidewall and extending towards the second sidewall, at least one of the fins of the set of fins not contacting the second sidewall such that there is an opening between a portion of an edge of the at least one fin and the second sidewall, the portion of the edge of the at least one fin being oriented towards the second sidewall and the opening between the portion of the edge of the at least one fin and the second sidewall extending along a complete distance between the first open end and the second open end, and the portion of the edge of the at least one fin is curved away from the first open end and towards the second sidewall and the second open end in order to assist debris in moving through the housing along the portion of the at least one fin away from the first open end and towards the second sidewall and the second open end, and wherein the at least one fin has a first curve shape and the set of fins includes a second fin having a second curve shape, the second fin having a second height that is less than a distance between the first sidewall and the second sidewall such that there is an opening between an edge of the second fin and the second sidewall, the second curve shape being different from the first curve shape; and
  a blower for blowing air through the fin pack from the first open end towards the second open end to move the heat from the set of fins out of the fin pack, wherein the opening is configured to allow debris to move freely through the fin pack from the first open end to the second open end.

7. The computing device of claim 6, wherein the second curve shape is arranged to assist debris in moving from the open first end towards the second sidewall and the open second end.

8. The computing device of claim 6, wherein the set of fins includes a third fin having a second height that spans the distance between the first sidewall and the second sidewall such that the third fin contacts the second sidewall.

9. The computing device of claim 6, wherein the fin pack further includes a plurality of openings between edges of each fin of the set of fins and the second sidewall such that there is an open space in the housing that extends from the third sidewall to the fourth sidewall.

10. The computing device of claim 6, further comprising a second processor.

11. The computing device of claim 6, wherein the heat pipe is adjacent the first sidewall.

12. The fin pack of claim 1, wherein the opening is no less than 0.1 millimeters.

* * * * *